United States Patent
Lee et al.

(10) Patent No.: US 9,379,568 B2
(45) Date of Patent: Jun. 28, 2016

(54) METHOD AND APPARATUS FOR CONTROLLING CHARGE OF A LOW-VOLTAGE BATTERY

(71) Applicant: Hyundai Motor Company, Seoul (KR)

(72) Inventors: Kyu Il Lee, Gyeonggi-do (KR); Kyung Won Suh, Seoul (KR); Seon Hak Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 126 days.

(21) Appl. No.: 14/260,554

(22) Filed: Apr. 24, 2014

(65) Prior Publication Data

US 2015/0115899 A1    Apr. 30, 2015

(30) Foreign Application Priority Data

Oct. 29, 2013  (KR) .................. 10-2013-0129286

(51) Int. Cl.
*H02J 7/00* (2006.01)
*H02J 7/04* (2006.01)
(Continued)

(52) U.S. Cl.
CPC .............. *H02J 7/007* (2013.01); *B60L 3/0053* (2013.01); *B60L 7/18* (2013.01); *B60L 11/1809* (2013.01); *B60L 11/1861* (2013.01); *B60L 11/1868* (2013.01); *B60L 11/1887* (2013.01); *B60L 2200/10* (2013.01); *B60L 2200/18* (2013.01); *B60L 2200/32* (2013.01); *B60L 2200/36* (2013.01); *B60L 2210/10* (2013.01); *B60L 2240/12* (2013.01); *B60L 2240/547* (2013.01); *B60L 2240/549* (2013.01); *B60L 2260/167* (2013.01); *G01R 19/00* (2013.01);
(Continued)

(58) Field of Classification Search
CPC .................. H02J 7/00; H02J 7/04; H02J 7/07; H02J 9/00; B60L 2260/167; H01M 2220/20; H01M 2250/20; Y02T 10/7005; Y02T 10/7072; G01R 19/12
USPC .................... 320/160, 104, 162; 307/150, 152
See application file for complete search history.

(56) References Cited

U.S. PATENT DOCUMENTS 3,992,658 A * 11/1976 Bechtold ............... H02J 7/0081
                                                                320/161
9,180,785 B2 * 11/2015 Lee ..................... B60L 11/1838
(Continued)

FOREIGN PATENT DOCUMENTS

JP          08-019115           1/1996
JP          2006-180658 A       7/2006
(Continued)

*Primary Examiner* — Phallaka Kik
(74) *Attorney, Agent, or Firm* — Mintz Levin Cohn Ferris Glovsky and Popeo, P.C.; Peter F. Corless

(57) ABSTRACT

A method and apparatus for controlling charge of a low-voltage battery are provided. The method includes assigning, by a controller, a preset voltage for the low-voltage battery based on an operating mode of a vehicle and a charge state of a high-voltage battery. In addition, the controller compares the preset voltage with a present charge voltage of the low-voltage battery and increases the present charge voltage with a first slope until the present charge voltage becomes equal to the preset voltage when the preset voltage is greater than the present charge voltage. The operating mode comprises drive modes that include a first drive mode and a second drive mode, a fuel cell stop mode, and an emergency mode. The first drive mode is divided into a plurality of stages based on the charge state of the high-voltage battery.

20 Claims, 5 Drawing Sheets

(51) Int. Cl.
  *H02J 9/00* (2006.01)
  *G01R 19/12* (2006.01)
  *B60L 11/18* (2006.01)
  *B60L 3/00* (2006.01)
  *B60L 7/18* (2006.01)
  *G01R 19/00* (2006.01)

(52) U.S. Cl.
  CPC ....... *H01M2220/20* (2013.01); *H01M 2250/20* (2013.01); *H02J 7/04* (2013.01); *H02J 9/00* (2013.01); *Y02T 10/7044* (2013.01); *Y02T 10/7066* (2013.01); *Y02T 10/7216* (2013.01); *Y02T 90/34* (2013.01)

(56) References Cited

U.S. PATENT DOCUMENTS

| | | | | |
|---|---|---|---|---|
| 2005/0035742 A1* | 2/2005 | Koo | ................... | G01R 31/3624 320/149 |
| 2005/0269993 A1* | 12/2005 | Palanisamy | ........ | G01R 31/3634 320/149 |
| 2007/0075678 A1* | 4/2007 | Ng | .......................... | H02J 7/047 320/106 |
| 2010/0219795 A1* | 9/2010 | Morimoto | ............. | H01M 10/44 320/145 |
| 2011/0301790 A1* | 12/2011 | Atluri | .................... | B60K 16/00 701/22 |
| 2013/0049673 A1* | 2/2013 | Agarwal | ............... | H02J 7/0016 320/101 |
| 2013/0127418 A1* | 5/2013 | Oh | ..................... | B60L 11/1816 320/109 |
| 2014/0306668 A1* | 10/2014 | Lee | .................... | B60L 11/1838 320/152 |

FOREIGN PATENT DOCUMENTS

| | | | |
|---|---|---|---|
| JP | 4957873 B2 | 6/2012 | |
| JP | 2013-208001 A | 10/2013 | |
| KR | 10-2008-0055401 A | 6/2008 | |
| KR | 10-2009-0104171 A | 10/2009 | |
| KR | 10-2013-0003978 | 1/2013 | |

* cited by examiner

METHOD AND APPARATUS FOR CONTROLLING CHARGE OF A LOW-VOLTAGE BATTERY

CROSS-REFERENCE(S) TO RELATED APPLICATION

The present application claims priority of Korean Patent Application Number 10-2013-0129286 filed on Oct. 29, 2013, the entire contents of which is incorporated herein for all purposes by this reference.

BACKGROUND (a) Technical Field

The present invention relates to a method and apparatus for controlling charge of a low-voltage battery, and more particularly, to a method and apparatus for controlling charge of a low-voltage battery to improve fuel efficiency by variably adjusting charge voltages of a low-voltage battery based on various drive modes while operating a vehicle and the charge state of a high-voltage battery.

(b) Background Art

For a fuel cell vehicle, a low-voltage direct-current converter (LDC) is used to reduce the voltage of fuel cells or high-voltage power to charge a low-voltage battery. Though a fixed voltage of about 14 V is generally used when charging a low-voltage battery using an LDC, continuous charging thereof may cause an excess charge of current in a low-voltage battery when the state of charge (SOC) of the battery is high, thus resulting in overheat and thermal loss.

SUMMARY

The present invention is designed to improve fuel efficiency by varying the charge voltages of a low-voltage DC converter according to various modes to charge a low-voltage battery.

A method for controlling charge of a low-voltage battery in accordance with an exemplary embodiment of the present invention may include: assigning, by a controller, a preset voltage for the low-voltage battery based on an operating mode of a vehicle and a charge state of a high-voltage battery; comparing, by a controller, the preset voltage with a present charge voltage of the low-voltage battery; and increasing, by the controller, the present charge voltage with a first slope until the present charge voltage is equal to the preset voltage when the preset voltage is greater than the present charge voltage. The operating mode may comprise drive modes that include a first drive mode and a second drive mode, a fuel cell stop mode, and an emergency mode. In particular, the first drive mode may be divided into a plurality of stages based on the charge state of the high-voltage battery.

The method for controlling charge of a low-voltage battery in accordance with an aspect of the present invention may further include a step of adjusting the magnitude of the present charge voltage after comparing the charge current of the low-voltage battery with the value of a predetermined current if the preset voltage is lower than the present charge voltage.

The method for controlling charge of a low-voltage battery may further include reducing, by the controller, the present charge voltage to the preset voltage when the charge current is greater than the value of the predetermined current. In addition, the method may include maintaining, by the controller, the present charge voltage when the charge current is less than the value of the predetermined current.

The process of reducing the present charge voltage may include reducing, by the controller, the present charge voltage with a second slope, wherein the first slope is greater than the second slope. The method may further include reducing, by the controller, the maintained voltage to the preset voltage when the charge current becomes greater than the value of the predetermined current and stopping, by the controller, the reduction of the present charge voltage when the charge current becomes less than the value of the predetermined current while reducing the present charge voltage.

The process of assigning a preset voltage may include assigning, by the controller, preset voltages that correspond to the second drive mode, the fuel cell stop mode, the emergency mode, and the divided stages, respectively. The second drive mode may include a regeneration mode for charging the battery with regenerative braking energy and a power assist mode for using both the energy of the fuel cell and the energy of the high-voltage battery.

An apparatus for controlling charge voltages of a low-voltage battery in accordance with an exemplary embodiment of the present invention may include: a fuel cell stack used as a primary power source and configured to supply power to a drive mechanism of a vehicle; a high-voltage DC converter supplied with power from the fuel cell stack; a high-voltage battery supplied with a voltage reduced by the high-voltage DC converter; a low-voltage DC converter configured to convert the voltage of the high-voltage battery; a low-voltage battery charged with a low voltage converted by the low-voltage DC converter; and a controller.

The controller may be configured to assign a preset voltage for the low-voltage battery based on an operating mode of the vehicle and a charge state of the high-voltage battery, compare the preset voltage with a present charge voltage of the low-voltage battery, and increase the present charge voltage with a first slope until the present charge voltage becomes equal to the preset voltage when the preset voltage is greater than the present charge voltage. The operating mode may comprise drive modes that include a first drive mode and a second drive mode, a fuel cell stop mode, and an emergency mode. In particular, the first drive mode may be divided into a plurality of stages based on the charge state of the high-voltage battery.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION

Figure 1:
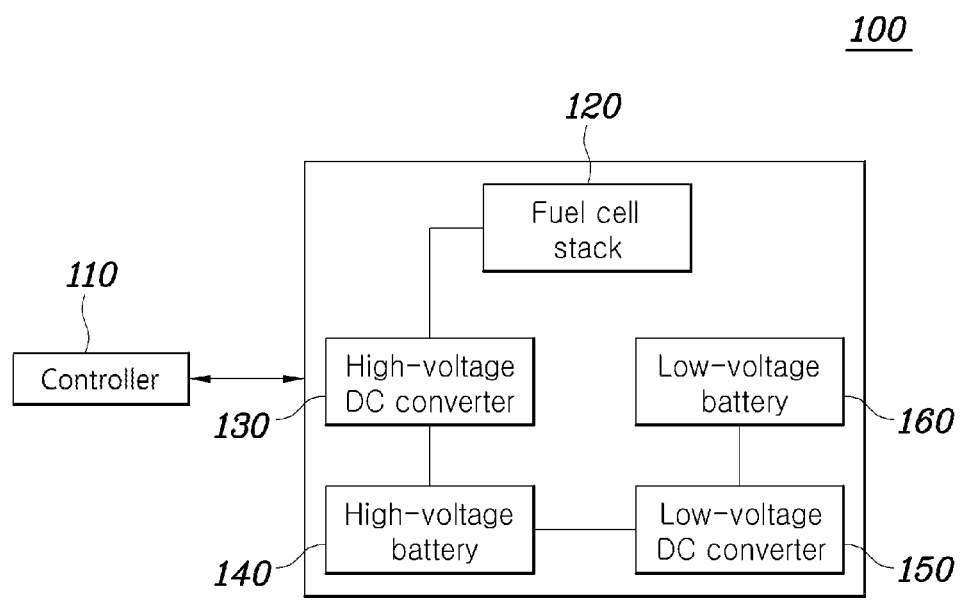
FIG. 1 is an exemplary diagram illustrating an apparatus for controlling charge voltages of a low-voltage battery in accordance with an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Specific structural or functional descriptions of exemplary embodiments according to the present invention disclosed herein is by way of illustration merely for describing the exemplary embodiments of the invention, and such embodiments of the invention can be carried out in various forms and it is understood that the present invention is not be limited to the embodiments disclosed herein. As the exemplary embodiments of the present invention are capable of various modification and variations, exemplary embodiments will be described below in detail with reference to the accompanying drawings. It should be understood that the exemplary embodiments according to the concepts of the present invention are not limited in any manner to those disclosed herein and all modifications, equivalents, and substitutes within the spirit and scope of the invention are fallen therein.

It will be understood that although the terms "first," "second," etc. are used herein to describe various elements, these elements should not be limited by these terms. These terms are used only to distinguish one element from another, for example, a first component may be referred to as a second component or vice versa, without departing from the scope of the concepts of the invention.

When referring to "connected" or "coupled" for one component to another, though it is possible for one component to be connected or coupled directly to another, it is also understood that there may be a third component therebetween. However, when referring to "directly connected" or "directly coupled" for one component to another, it is understood that there is no other component therebetween. So are the expressions for describing inter-relationship between components such as "between," "directly between," "adjoining," "directly adjoining," etc.

The terms used herein are illustrative purpose only for describing particular embodiments and are not intended to limit the invention. Expressions of singular items also include plural items unless otherwise clearly indicated in the context. The terms used herein such as "comprising," "having," etc. are intended to define existence of features, numbers, steps, actions, components, parts, or combinations thereof described herein, and it is not intended to preclude the possibility of existence or addition of one or more of the features, numbers, steps, actions, components, parts, or combinations thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless otherwise defined, all the terms used herein including technical or scientific terms have the same meaning commonly understood by a person having an ordinary skill in the art to which the invention pertains. The terms defined in dictionaries that are commonly used are to have the same meaning in the context of relevant technology, and should not be construed to have an overly or excessively formal meaning unless otherwise clearly defined.

FIG. 1 is an exemplary diagram illustrating an apparatus for controlling charge voltages of a low-voltage battery in accordance with an exemplary embodiment of the present invention. The apparatus 100 for controlling charge voltages of a low-voltage battery may include a fuel cell stack 120 operating as a primary power source and configured to supply power to a drive component of a vehicle, a high-voltage DC converter 130 supplied with power from the fuel cell stack 120, a high-voltage battery 140 supplied with a voltage reduced by the high-voltage DC converter 130, a low-voltage DC converter 150 configured to convert the voltage of the high-voltage battery 140, a low-voltage battery 160 charged with a low voltage converted by the low-voltage DC converter 150, and a controller 110 configured to adjust the charge of the low-voltage battery 160.

Figure 2:
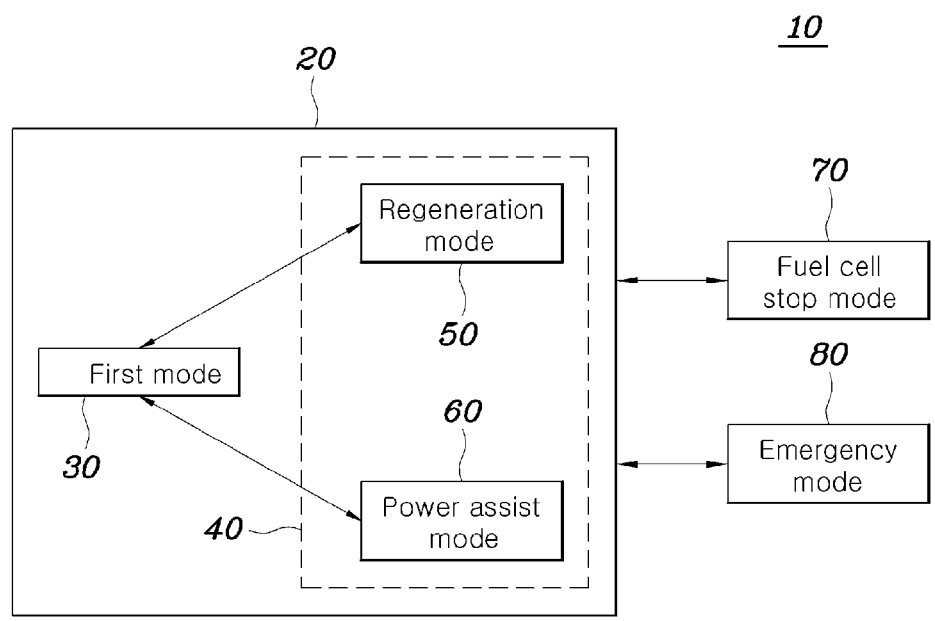
FIG. 2 is an exemplary diagram illustrating a relationship between operating modes to perform a method for controlling charge voltages of a low-voltage battery in accordance with an exemplary embodiment of the present invention.
Figure 3:
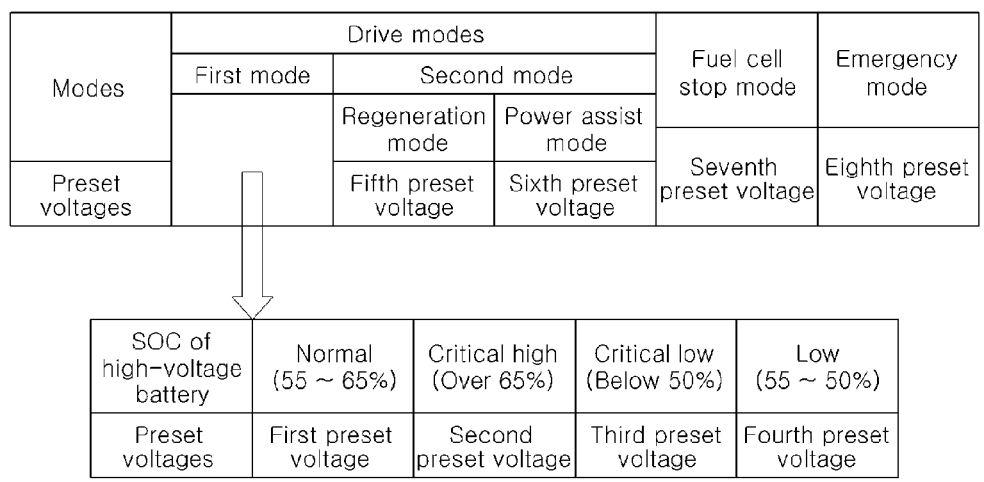
FIG. 3 shows exemplary tables of preset charge voltages of a low-voltage battery by operating modes in a method for controlling charge voltages of a low-voltage battery in accordance with an exemplary embodiment of the present invention.

FIG. 2 is an exemplary diagram illustrating a relationship between operating modes to perform a method for controlling charge voltages of a low-voltage battery in accordance with an exemplary embodiment of the present invention, and FIG. 3 shows exemplary tables of preset charge voltages of a low-voltage battery by operating modes in a method for controlling charge voltages of a low-voltage battery in accordance with an exemplary embodiment of the present invention. The charge voltages for charging the low-voltage battery may be assigned differently by a variety of modes.

In particular, operating modes may be sorted into a plurality of modes and may comprise drive modes 20 that may include a first drive mode 30 and a second drive mode 40, a fuel cell stop mode 70, and an emergency mode 80. The controller may be configured to determine which mode the vehicle is in and adjust the charge of the low-voltage battery based on the preset charge voltages predetermined by the various modes. The first drive mode 30 may be divided into a plurality of stages based on the state of charge (SOC) of the high-voltage battery. The first drive mode 30 may be the drive mode except the second drive mode 40 comprising a regeneration mode 50 and a power assist mode 60 of the drive modes 20 which represent that a vehicle is being driven.

The plurality of stages may include four stages classified, for example, based on the SOC of the high-voltage battery, and the four stages may include a normal stage where the SOC of the high-voltage battery is between about 55% and 65%, a critical high stage where the SOC of the high-voltage battery is greater than about 65%, a critical low stage where the SOC of the high-voltage battery is less than about 50%, and a low stage where the SOC of the high-voltage battery is between about 50% and 55%.

The regeneration mode 50 of the second drive mode 40 may be a mode that recovers the regenerative braking energy from the motor, and specifically the kinetic energy of the vehicle may be converted into electric energy through the generation of the motor during deceleration or braking to charge the high-voltage battery. When a brake pedal is engaged, the first drive mode 30 may be changed into the regeneration mode to recover the regenerative braking energy from the motor. In addition, when an acceleration pedal is engaged for normal drive when the vehicle is in the regeneration mode 50, the vehicle may be changed back to the first drive mode 30.

The power assist mode 60 may use both the power from the fuel cell and the power from the high-voltage battery simultaneously and may be the drive mode when a driver engages the acceleration pedal more than a predetermined depth or when a preset fuel cell power is reached. When a driver engages the acceleration pedal more than a preset depth or a preset fuel cell power is reached while driving in the first drive mode 30, then the vehicle may be changed into the power assist mode 60 or vice versa.

The fuel cell stop mode 70 may be a zone in which a vehicle operates with only the high-voltage battery by stopping the fuel cell in a low power zone or low speed zone (e.g., below a predetermined threshold). Since the voltage of the fuel cell may increase when operating in the low power zone, causing an adverse effect on the durability of the fuel cell, the operation of the fuel cell should be stopped in the low power zone. In general, the mode of a vehicle may be changed into the regeneration mode 50 when speed is reduced to brake the vehicle in the first drive mode 30, into the fuel cell stop mode 70 when the vehicle stops completely, and into the first drive mode 30 by activating the fuel cell again when a predetermined speed or power is exceeded.

The emergency mode 80 may be an urgent mode when a vehicle is operated with only the high-voltage battery when the fuel cell system is out of order (e.g., has failed). In general, though the fuel cell may not be activated again in case of the emergency mode 80 until the vehicle is turned off, an effort may be made to activate the fuel cell again to change the mode to the first drive mode 30 in case of hydrogen leak or the fuel cell malfunction, and when activation of the fuel cell fails, then the emergency mode 80 may be maintained until the vehicle is turned off.

As shown in FIG. 2, the preset charge voltages may be assigned for the low-voltage battery based on the operating modes of the vehicle and the SOC of the high-voltage battery. For instance, the controller (shown in FIG. 1) of the apparatus may be configured to assign a first preset voltage when the present charge state of the high-voltage battery is in the normal stage, a second preset voltage for the critical high stage, a third preset voltage for the critical low stage, and a fourth preset voltage for the low stage as the charge voltage, based on the plurality of stages defined based on the SOC of the high-voltage battery when a vehicle is in the first drive mode 30. The first preset voltage may be less than the second preset voltage but greater than the third and fourth preset voltages. The second preset voltage may be greater than the first, third, and fourth preset voltages. The third preset voltage may be less than the first, second, and fourth preset voltages and the fourth preset voltage may be less than the first and second preset voltages but greater than the third preset voltage.

In addition, the controller may be configured to assign a fifth preset voltage for the low-voltage battery as the charge voltage when the vehicle is in the regeneration mode 50 of the second drive mode 40 and a sixth preset voltage for the low-voltage battery as the charge voltage when the vehicle is in the power assist mode 60 of the second drive mode 40. The controller may be configured to assign, for example, a seventh preset voltage as the charge voltage when the vehicle is in the fuel cell stop mode 70 and an eighth preset voltage as the charge voltage when the vehicle is in the emergency mode 80.

In general, the vehicle may enter into the fuel cell stop mode 70 via the regeneration mode 50. The fifth preset voltage may be greater than the sixth, seventh, and eighth preset voltages and the sixth and eighth preset voltages may be greater than the seventh preset voltage. For instance, the controller may be configured to assign the fifth preset voltage greater than the voltage of the low-voltage battery or about 12 V as the charge voltage when the vehicle is in the regeneration mode 50. Accordingly, since the low-voltage battery may be sufficiently charged, the seventh preset voltage may be assigned to be greater than the voltage of the low-voltage battery as the charge voltage when the vehicle is in the fuel cell stop mode 70.

Thus, the fuel efficiency of a fuel cell and hybrid vehicle may be improved by assigning charge voltages to charge a low-voltage battery differently based on operating modes of the vehicle and the charge state of a high-voltage battery. However, the numerical values representing the degree of the SOC of the high-voltage battery for specifying such preset charge voltages and stages are merely exemplary embodiments and are not limited thereto, and may be defined differently according to various exemplary embodiments.

Figure 4:
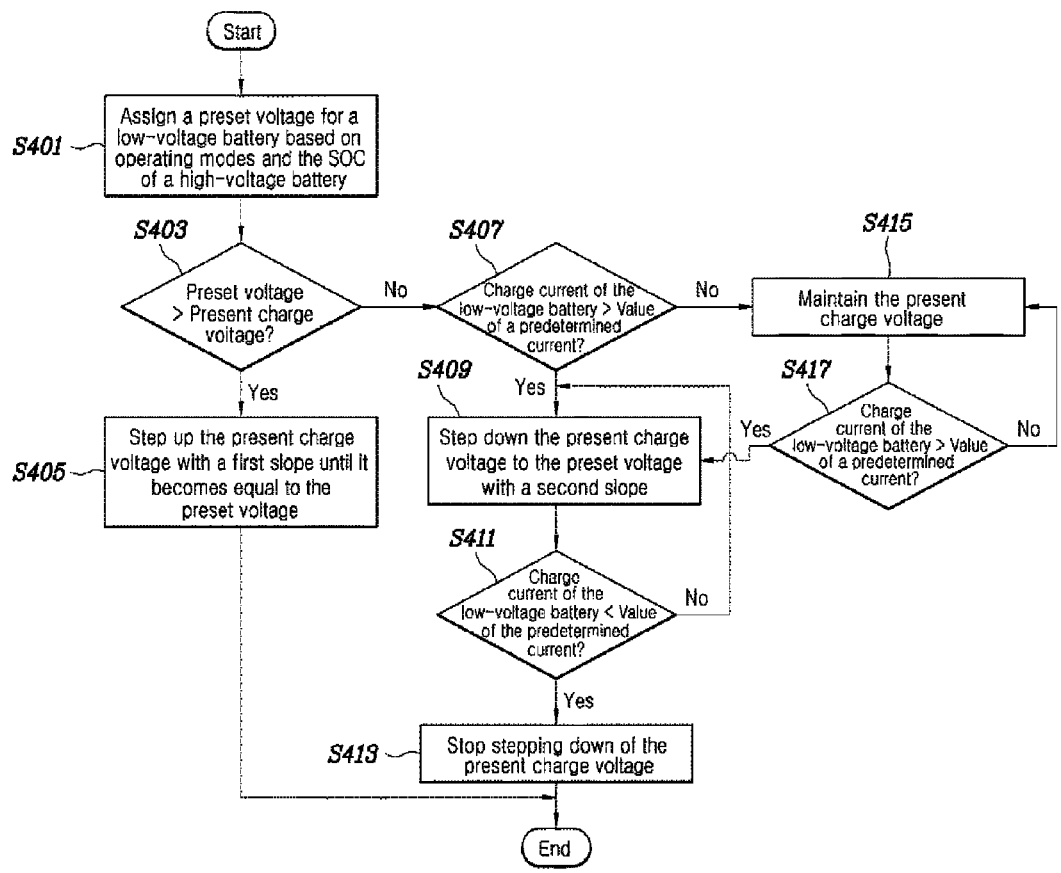
FIG. 4 is an exemplary flow chart illustrating a method for controlling charge voltages of a low-voltage battery in accordance with an exemplary embodiment of the present invention.

FIG. 4 is an exemplary flow chart illustrating a method for controlling charge voltages of a low-voltage battery in accordance with an exemplary embodiment of the present invention. First, a preset voltage may be assigned, by a controller, for a low-voltage battery 160 based on operating modes of a vehicle and the charge state of a high-voltage battery 140 at S401. The assigning of a charge voltage for the low-voltage battery 160 is as described above with reference to FIGS. 2 and 3.

In particular, the controller 110 may be configured to determine whether the assigned preset voltage is greater than the present charge voltage of the low-voltage battery 160 at S403. When the preset voltage is greater than the present charge voltage of the low-voltage battery 160, the controller 110 may be configured to increase (e.g., by steps) the present charge voltage of the low-voltage battery 160 with a first slope (e.g., increase the voltage based on the first slope) until the present charge voltage is equal to the preset voltage at S405. The first slope may be, for example, about 1 V/s. By increasing the voltage based on the first slope, an overshoot of a charge current may be prevented which may occur when the voltage is instantly increased.

When the preset voltage is less than the present charge voltage of the low-voltage battery 160, the controller 110 may be configured to compare the charge current of the low-voltage battery 160 with the value of a predetermined current at S407. When the charge current of the low-voltage battery 160 is greater than the value of the predetermined current, then the present charge voltage of the low-voltage battery 160 may be decreased to the preset voltage, where the reduction slope (e.g., the step-down slope) may be a second slope at S409. For example, the value of the predetermined current may be about 10 A and the second slope may be about 0.5 V/s. In other words, the second slope may be less than the first slope described above. When the charge current of the low-voltage battery 160 is less than the value of the predetermined current, the controller 110 may be configured to maintain the present charge voltage of the low-voltage battery 160 as set at S415.

Thereafter, the controller 110 may be configured to compare the charge current of the low-voltage battery 160 with the value of the predetermined current once again at S417, and when the charge current of the low-voltage battery 160 is greater than the value of the predetermined current, the present charge voltage of the low-voltage battery 160 may be reduced to the preset voltage with the second slope at S409. Since the low-voltage DC converter 150 may enter into a state of no load or without any current flowing therethrough and since damage may occurred when the charge current of the low-voltage battery is substantially low, the charge voltage should be gradually reduced (e.g., step reduction) to the preset voltage to prevent the low-voltage DC converter 150 from being in a state of no load when the preset voltage is less than the present charge voltage of the low-voltage battery 160 after checking the charge current.

The controller 110 may be configured to compare the charge current of the low-voltage battery 160 with the value of the predetermined current at S411 while reducing the charge voltage of the low-voltage battery 160, and may be configured to stop the reduction of the present charge voltage at S413 when the charge current of the low-voltage battery 160 becomes less than the value of the predetermined current.

Figure 5:
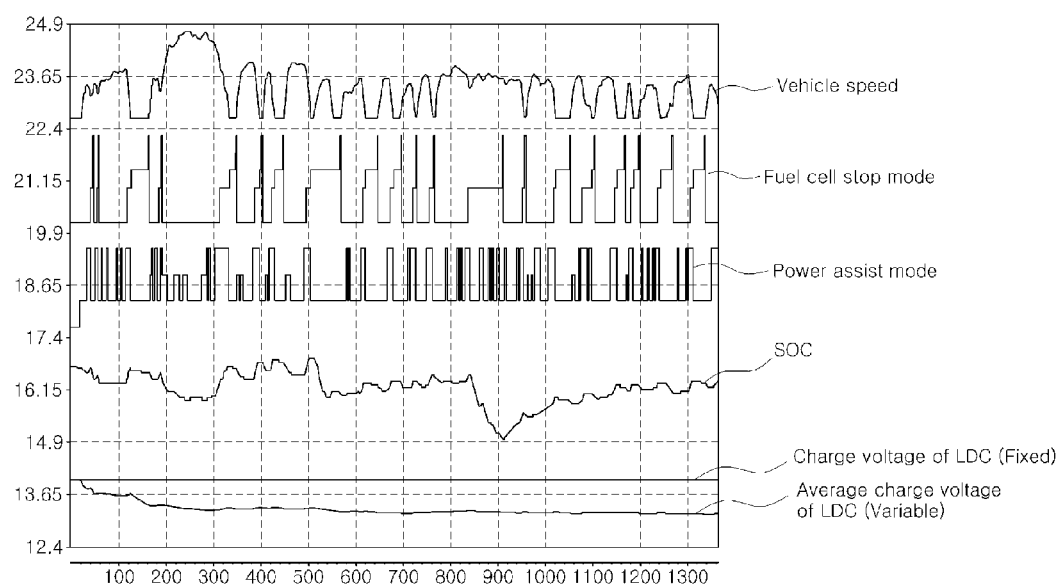
FIG. 5 is an exemplary graph showing simulation results after performing a method for controlling charge voltages of a low-voltage battery in accordance with an exemplary embodiment of the present invention.

FIG. 5 is an exemplary graph showing simulation results after performing a method for controlling charge voltages of a low-voltage battery in accordance with an exemplary embodiment of the present invention.

The method of controlling charge of a low-voltage battery in accordance with an exemplary embodiment of the present invention may improve fuel efficiency by setting and charging with a variety of preset voltages for a low-voltage battery when operating a vehicle in a variety of drive patterns. In addition, the invention may prevent the current flow from a low-voltage DC/AC converter from being stopped when increasing or decreasing a charge voltage when a difference exists between the present charge voltage of a low-voltage battery and a preset voltage. In particular, FIG. 5 shows that the charge voltage may be fixed at about 14 V for a conventional method of charging a low-voltage battery. However, the charging of the low-voltage battery 160 according to an exemplary embodiment of the present invention shows that the average charge voltage may decrease to about 13.18 V to improve fuel efficiency.

What is claimed is:

1. A method for controlling charge voltages of a low-voltage battery, comprising:
assigning, by a controller, a preset voltage for the low-voltage battery based on an operating mode of a vehicle and a charge state of a high-voltage battery;
comparing, by the controller, the preset voltage with a present charge voltage of the low-voltage battery; and
increasing, by the controller, the present charge voltage with a first slope until the present charge voltage is equal to the preset voltage when the preset voltage is greater than the present charge voltage,
wherein the operating mode comprises drive modes that include a first drive mode and a second drive mode, a fuel cell stop mode, and an emergency mode, and
wherein the first drive mode is divided into a plurality of stages based on the charge state of the high-voltage battery.

2. The method of claim 1, further comprising:
adjusting, by the controller, the magnitude of the present charge voltage after comparing the charge current of the low-voltage battery with the value of a predetermined current when the preset voltage is less than the present charge voltage.

3. The method of claim 2, further comprising:
decreasing, by the controller, the present charge voltage to the preset voltage when the charge current is greater than the value of the predetermined current.

4. The method of claim 3, wherein the reduction process includes:
reducing, by the controller, the present charge voltage with a second slope, wherein the first slope is greater than the second slope.

5. The method of claim 4, further comprising:
stopping, by the controller, the decrease of the present charge voltage when the charge current becomes less than the value of the predetermined current while decreasing the present charge voltage.

6. The method of claim 2, further comprising:
maintaining, by the controller, the present charge voltage when the charge current is less than the value of the predetermined current.

7. The method of claim 6, further comprising:
decreasing, by the controller, the maintained voltage to the preset voltage when the charge current becomes greater than the value of the predetermined current.

8. The method of claim 1, wherein the assigning process includes:
assigning, by the controller, preset voltages that correspond to the second drive mode, the fuel cell stop mode, the emergency mode, and the divided stages, respectively.

9. The method of claim 1, wherein the second drive mode includes a regeneration mode for charging the battery with regenerative braking energy and a power assist mode for using both the energy of the fuel cell and the energy of the high-voltage battery.

10. An apparatus for controlling charge voltages of a low-voltage battery, comprising:
a fuel cell stack operated as a primary power source and configured to supply power to a drive component of a vehicle;
a high-voltage direct current (DC) converter supplied with power from the fuel cell stack;

a high-voltage battery supplied with a voltage reduced by the high-voltage DC converter;

a low-voltage DC converter configured to convert the voltage of the high-voltage battery;

a low-voltage battery charged with a substantially low voltage converted by the low-voltage DC converter; and a controller configured to:

assign a preset voltage for the low-voltage battery based on an operating mode of the vehicle and a charge state of the high-voltage battery;

compare the preset voltage with a present charge voltage of the low-voltage battery; and increase the present charge voltage with a first slope until the present charge voltage becomes equal to the preset voltage when the preset voltage is greater than the present charge voltage, wherein the operating mode comprises drive modes that include a first drive mode and a second drive mode, a fuel cell stop mode, and an emergency mode, and wherein the first drive mode is divided into a plurality of stages based on the charge state of the high-voltage battery.

11. The apparatus of claim 10, wherein the controller is further configured to:

adjust the magnitude of the present charge voltage after comparing the charge current of the low-voltage battery with the value of a predetermined current when the preset voltage is less than the present charge voltage.

12. The apparatus of claim 11, wherein the controller is further configured to:

decrease the present charge voltage to the preset voltage when the charge current is greater than the value of the predetermined current.

13. The apparatus of claim 12, wherein the controller is further configured to:

reduce the present charge voltage with a second slope, wherein the first slope is greater than the second slope.

14. The apparatus of claim 11, wherein the controller is further configured to:

maintain the present charge voltage when the charge current is less than the value of the predetermined current.

15. The apparatus of claim 14, wherein the controller is further configured to:

decrease the maintained voltage to the preset voltage when the charge current becomes greater than the value of the predetermined current.

16. A non-transitory computer readable medium containing program instructions executed by a controller, the computer readable medium comprising:

program instructions that assign a preset voltage for the low-voltage battery based on an operating mode of a vehicle and a charge state of a high-voltage battery;

program instructions that compare the preset voltage with a present charge voltage of the low-voltage battery; and program instructions that increase the present charge voltage with a slope until the present charge voltage is equal to the preset voltage when the preset voltage is greater than the present charge voltage, wherein the operating mode comprises drive modes that include a first drive mode and a second drive mode, a fuel cell stop mode, and an emergency mode, and wherein the first drive mode is divided into a plurality of stages based on the charge state of the high-voltage battery.

17. The non-transitory computer readable medium of claim 16, further comprising:

program instructions that adjust the magnitude of the present charge voltage after comparing the charge current of the low-voltage battery with the value of a predetermined current when the preset voltage is less than the present charge voltage.

18. The non-transitory computer readable medium of claim 17, further comprising:

program instructions that decrease the present charge voltage to the preset voltage when the charge current is greater than the value of the predetermined current.

19. The non-transitory computer readable medium of claim 18, further comprising:

program instructions that reduce the present charge voltage with a second slope, wherein the first slope is greater than the second slope.

20. The non-transitory computer readable medium of claim 17, further comprising:

program instructions that maintain the present charge voltage when the charge current is less than the value of the predetermined current.

* * * * *